United States Patent
Kim et al.

(10) Patent No.: US 11,852,581 B2
(45) Date of Patent: Dec. 26, 2023

(54) METHOD FOR CALIBRATING NANO MEASUREMENT SCALE AND STANDARD MATERIAL USED THEREIN

(71) Applicant: KOREA RESEARCH INSTITUTE OF STANDARDS AND SCIENCE, Daejeon (KR)

(72) Inventors: Kyung Joong Kim, Daejeon (KR); Gyea Young Kwak, Daejeon (KR); Taegun Kim, Cheongju-si (KR); Hyungung Yu, Daejeon (KR); Seung Mi Lee, Daejeon (KR)

(73) Assignee: KOREA RESEARCH INSTITUTE OF STANDARDS AND SCIENCE

( * ) Notice: Subject to any disclaimer, the term of this patent is extended or adjusted under 35 U.S.C. 154(b) by 440 days.

(21) Appl. No.: 17/338,539

(22) Filed: Jun. 3, 2021

(65) Prior Publication Data

US 2022/0187195 A1 Jun. 16, 2022

(30) Foreign Application Priority Data

Dec. 15, 2020 (KR) .................. 10-2020-0175124

(51) Int. Cl.
| | | |
|---|---|---|
| *G01N 21/27* | (2006.01) | |
| *G01Q 40/02* | (2010.01) | |
| *B82Y 35/00* | (2011.01) | |
| *G01Q 60/24* | (2010.01) | |
| *H01J 37/28* | (2006.01) | |

(52) U.S. Cl.
CPC .......... *G01N 21/274* (2013.01); *G01Q 40/02* (2013.01); *B82Y 35/00* (2013.01); *G01Q 60/24* (2013.01); *H01J 37/28* (2013.01)

(58) Field of Classification Search
CPC ...... G01N 21/274; G01Q 40/02; G01Q 60/24; B82Y 35/00; H01J 37/28
See application file for complete search history.

(56) References Cited

U.S. PATENT DOCUMENTS

| | | |
|---|---|---|
| 6,354,133 B1 | 3/2002 | Yedur et al. |
| 6,570,157 B1 | 5/2003 | Singh et al. |
| (Continued) | | |

FOREIGN PATENT DOCUMENTS

| | | |
|---|---|---|
| JP | 2007078679 A | 3/2007 |
| JP | 2008215824 A | 9/2008 |
| KR | 101247835 B1 | 3/2013 |

OTHER PUBLICATIONS

Kurosawa, T., "Recent Trend of Standardization of Scanning Probe Microscope and Standards for Calibration," Journal of Surface Analysis, vol. 11, No. 3, Nov. 11, 2004, 11 pages.

(Continued)

*Primary Examiner* — Nicole M Ippolito
(74) *Attorney, Agent, or Firm* — McCoy Russell LLP

(57) ABSTRACT

Provided is a method of calibrating a nano measurement scale using a standard material including: measuring widths of a plurality of nanostructures included in the standard material and having pre-designated certified values of different sizes by a microscope; determining measured values for the widths of each of the plurality of nanostructures measured by the microscope based on a predetermined criterion; and calibrating a measurement scale of the microscope based on the certified values and the measured values.

8 Claims, 10 Drawing Sheets

(56) References Cited

U.S. PATENT DOCUMENTS

| | | | |
|---|---|---|---|
| 2007/0040117 A1 | 2/2007 | Ito et al. | |
| 2008/0203285 A1 | 8/2008 | Sohda et al. | |
| 2014/0317791 A1* | 10/2014 | Kaneko | C30B 23/02 |
| | | | 850/20 |
| 2022/0283090 A1* | 9/2022 | Zurauskas | G01N 21/6458 |
| 2022/0326214 A1* | 10/2022 | Postma | G01N 33/48721 |
| 2023/0287402 A1* | 9/2023 | Sasson | C12N 15/63 |
| | | | 536/23.1 |

OTHER PUBLICATIONS

Misumi, I. et al., "Development of Nanometric Lateral Scales (2nd Report)," Proceedings of the Japan Society for Precision Engineering Spring Convention Academic Lecture Meeting, May 1, 2006, 3 pages.

Japanese Patent Office, Office Action Issued in Application No. 2021-082290, dated Jul. 11, 2023, 7 pages.

European Patent Office, Extended European Search Report Issued in Application No. 21174398.4, dated Oct. 29, 2021, Germany, 8 pages.

Japanese Patent Office, Office Action Issued in Application No. 2021-082290, dated May 24, 2022, 8 pages.

Japanese Patent Office, Office Action Issued in Application No. 2021-082290, dated Jan. 10, 2023, 9 pages. (Submitted with Machine Translation).

* cited by examiner

METHOD FOR CALIBRATING NANO MEASUREMENT SCALE AND STANDARD MATERIAL USED THEREIN

CROSS-REFERENCE TO RELATED APPLICATION

This present application claims priority to Korean Patent Application No. 10-2020-0175124 filed on Dec. 15, 2020. The entire contents of the above-listed application is hereby incorporated by reference for all purposes.

TECHNICAL FIELD

The following disclosure relates to a method for calibrating a nano measurement scale and a standard material used therein, and more particularly, to a standard material including a nanostructure having a pre-designated certified value and a method for calibrating a measurement scale in measurement by a microscope using the same.

BACKGROUND

An atomic force microscope (AFM) or a scanning electron microscope (SEM) is a microscope that measures a critical dimension (CD) and pitch at a nano level in a process of manufacturing a semiconductor device. Currently, the value measured by a microscope deviates from an actual value depending on the conditions of use of the microscope.

In particular, with the recent development of a system semiconductor industry, a technology of accurately measuring a line width, a pitch, and a step of only a few nanometers is one of the most important process analysis issues in the semiconductor industry. Moreover, as a size of the semiconductor device decreases, devices of smaller sizes are developed. Therefore, an accurate definition of a difference between a measured value and an actual value is required.

SUMMARY

An embodiment of the present invention is directed to providing a method of calibrating a nano measurement scale that calibrates a measurement scale of a microscope by measuring a standard material including a plurality of nanostructures having a series of certified values having different sizes with the microscope and determining the degree to which a measured value deviates from the certified values, and a standard material used therein.

In one general aspect, a method of calibrating a nano measurement scale using a standard material includes: measuring widths of a plurality of nanostructures included in the standard material and having pre-designated certified values of different sizes by a microscope; determining measured values for the widths of each of the plurality of nanostructures measured by the microscope based on a predetermined criterion; and calibrating a measurement scale of the microscope based on the certified values and the measured values, wherein the standard material includes the plurality of nanostructures having the widths set as the certified values of the pre-designated certified values of different sizes and spaced apart from each other by a predetermined interval, and a plurality of intermediate layers interposed in the intervals where the plurality of nanostructures are spaced apart, on one surface of the standard material in which the plurality of nanostructures and the plurality of intermediate layers are alternately stacked, a plurality of concave portions in which each of the plurality of intermediate layers is removed to a predetermined depth, and a plurality of convex portions in which each of the plurality of nanostructures protrudes from bottoms of the plurality of concave portions are formed, and one surface of the standard material is perpendicular to an interface between the plurality of nanostructures and the plurality of intermediate layers.

The width of each of the plurality of nanostructures or a line width of the plurality of convex portions may have a designated value among values between 5 nm and 100 nm.

The plurality of nanostructures may be sequentially arranged according to the sizes of the widths.

The width of each of the plurality of nanostructures may linearly increase according to an arrangement direction.

The plurality of intermediate layers may have thicknesses having a designated value among values between 50 nm and 100 nm.

A depth of the plurality of concave portions or a protruding length of the plurality of convex portions may correspond to a predetermined multiple of 5 to 10 times compared to a minimum width of the plurality of nanostructures.

The calibrating of the measurement scale of the microscope may include: indicating a plurality of points having the certified value as an x-coordinate and the measured value as a y-coordinate on an x-y coordinate plane; and obtaining a linear function by linearly fitting the plurality of points.

The calibrating of the measurement scale of the microscope may further include calibrating the measured values by subtracting a y-intercept of the linear function from the measured values and dividing the subtracted value by a slope of the linear function.

DETAILED DESCRIPTION

Hereinafter, preferred embodiments of the present invention will be described in detail with reference to the accompanying drawings.

The terms used in the present specification are terms defined in consideration of the functions of the present invention, and may vary according to the custom or intention of users or operators. Therefore, these terms should be defined on the basis of the contents throughout the present specification.

Further, the embodiments disclosed below do not limit the scope of the present invention, but are merely exemplary matters of the components presented in the claims of the present invention, and the embodiments included in the technical idea throughout the specification of the present invention and including components that may be substituted as equivalents in the components of the claims may be included in the scope of the present invention.

In addition, terms such as "first", "second", "one side", and "the other side" in the embodiments disclosed below are used to distinguish one component from other components, and the components are not limited by the terms described above. Hereinafter, in describing the present invention, detailed descriptions of known technologies that may obscure the subject matter of the present invention will be omitted.

Figure 1:
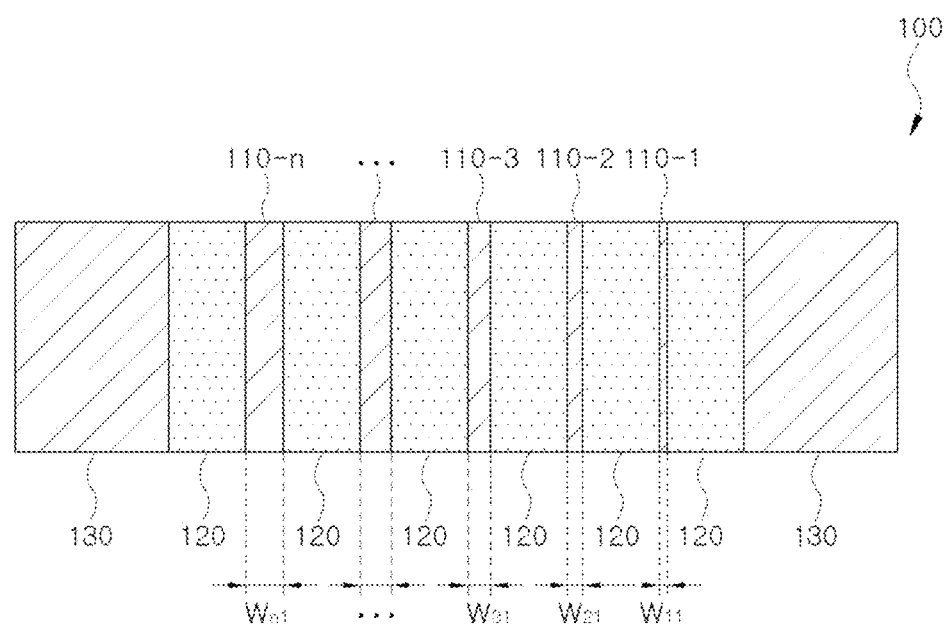
FIG. 1 is a cross-section view of a standard material used in a method of calibrating a nano measurement scale according to a first embodiment of the present invention.

FIG. 1 is a cross-section view of a standard material used in a method of calibrating a nano measurement scale according to a first embodiment of the present invention.

Referring to FIG. 1, a standard material 100 used in a method of calibrating a nano measurement scale according to a first embodiment of the present invention includes a plurality of nanostructures 110 and a plurality of intermediate layers 120. The plurality of nanostructures 110 and the plurality of intermediate layers 120 are formed to be alternately stacked with each other, and may be made of different materials. The standard material 100 may further include support layers 130 at both ends thereof.

The plurality of nanostructures 110 have a designated value among values between 5 nm and 100 nm as a width. At this time, the widths $w_{11}, w_{21}, \ldots, w_{n1}$ of each of the plurality of nanostructures 110 are referred to as certified values $V_{cert}$. The certified values of different sizes are each assigned to the plurality of nanostructures. For example, according to the size of the certified value, that is, a size of the width, each of the plurality of nanostructures 110 is spaced apart at regular intervals. As in the illustrated embodiment, a plurality of nanostructures 110-1, 110-2, ..., 110-n having the widths of different sizes are sequentially arranged according to the sizes of the widths such that the standard material 100 may have a nano-pattern as illustrated. Here, the width of each of the plurality of nanostructures 110-1, 110-2, ..., 110-n has a size that linearly increases according to an arrangement direction.

The plurality of nanostructures 110-1, 110-2, ..., 110-n have the widths of certified values of different sizes designated among values between 5 nm and 100 nm, and are disposed to be spaced apart from each other at predetermined intervals.

The plurality of intermediate layers 120 serve to distinguish each of the plurality of nanostructures, and are interposed in the intervals where the plurality of nanostructures are spaced apart. Thicknesses of the plurality of intermediate layers correspond to the spaced intervals of the plurality of nanostructures. As in the illustrated embodiment, the plurality of intermediate layers are formed to have the same thickness such that the spaced intervals by which the plurality of nanostructures are spaced apart from each other may be the same.

The thickness of the plurality of intermediate layers 120 has a predetermined value between 50 nm and 100 nm.

Figure 2:
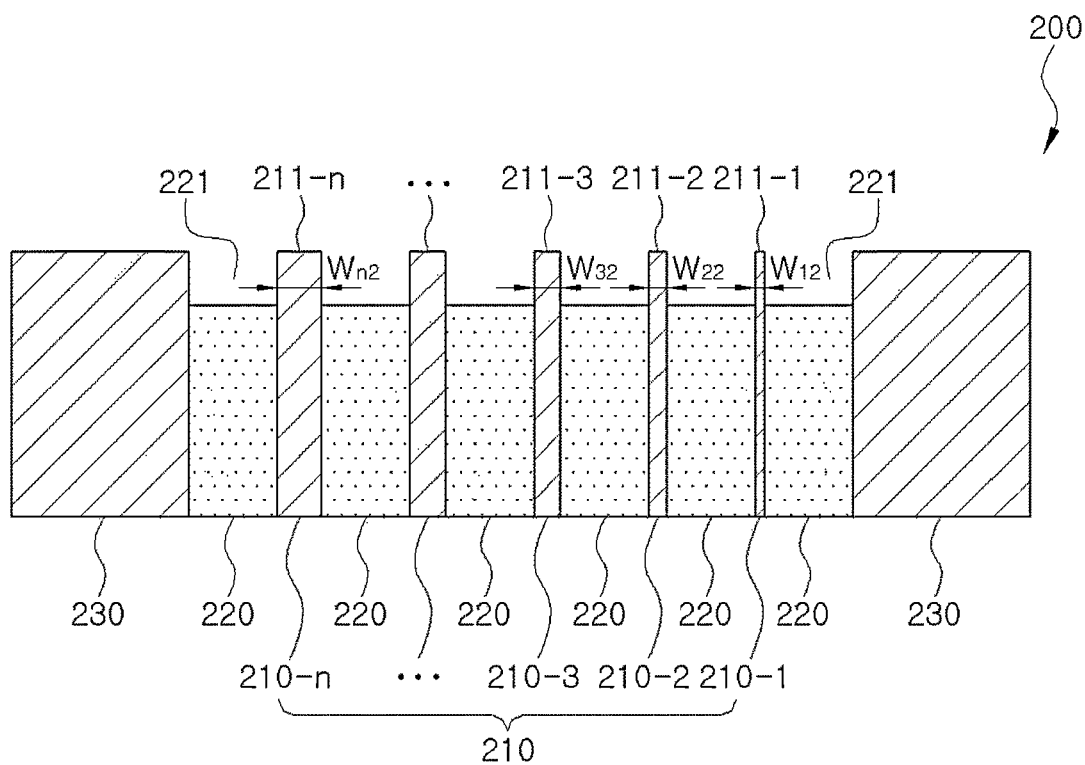
FIG. 2 is a cross-section view of a standard material used in a method of calibrating a nano measurement scale according to a second embodiment of the present invention.

FIG. 2 is a cross-section view of a standard material used in a method of calibrating a nano measurement scale according to a second embodiment of the present invention.

Referring to FIG. 2, a standard material 200 used in a method of calibrating a nano measurement scale according to a second embodiment of the present invention includes a plurality of nanostructures 210 and a plurality of intermediate layers 220. The plurality of nanostructures 210 and the plurality of intermediate layers 220 are formed to be alternately stacked with each other. The standard material 200 may further include support layers 230 at both ends thereof. One surface of the standard material 200 including the plurality of nanostructures 210 and the plurality of intermediate layers 220, that is, a surface perpendicular to a stacking interface of the plurality of nanostructures 210 and the plurality of intermediate layers 220, includes a plurality of concave portions 221 formed while each of the plurality of intermediate layers 220 is removed from the uppermost portion of the one surface to a predetermined depth and a plurality of convex portions 211 in which each of the plurality of nanostructures protrudes from bottoms of the plurality of concave portions.

Each of the plurality of convex portions 211 is a portion of each of the plurality of nanostructures 210.

The plurality of nanostructures 210 have a designated value among values between 5 nm and 100 nm as a width. At this time, the widths $w_{12}, w_{22}, \ldots, w_{n2}$ of each of the plurality of nanostructures 210 are referred to as certified values $V_{cert}$. The certified values of different sizes are each assigned to the plurality of nanostructures 210. For example, according to the size of the certified value, that is, a size of the width, each of the plurality of nanostructures 210 is spaced apart at regular intervals. As in the illustrated embodiment, a plurality of nanostructures 210-1, 210-2, ..., 210-n having the widths of different sizes are sequentially arranged according to the sizes of the widths such that the standard material 200 may have a nano-pattern as illustrated. The width of each of the plurality of nanostructures 210-1, 210-2, ..., 210-n has a size that linearly increases according to an arrangement direction.

The plurality of nanostructures 210-1, 210-2, ..., 210-n have the widths of certified values of different sizes designated among values between 5 nm and 100 nm, and are disposed to be spaced apart from each other at predetermined intervals. A line width of each of the plurality of convex portions 211-1, 211-2, ..., 211-n, which is a portion of the plurality of nanostructures, is the same as the width of the plurality of nanostructures.

A protrusion length of the plurality of convex portions 211 with respect to the bottom of the plurality of concave portions, that is, a depth of the plurality of concave portions, corresponds to a minimum value among certified values designated among values between 5 nm and 100 nm, that is, a value corresponding to a predetermined multiple of 5 to 10 times compared to the minimum value among the widths of the plurality of nanostructures.

The plurality of intermediate layers 220 serve to distinguish each of the plurality of nanostructures, and are interposed in the intervals where the plurality of nanostructures are spaced apart. Thicknesses of the plurality of intermediate layers correspond to the spaced intervals of the plurality of nanostructures. As in the illustrated embodiment, the plurality of intermediate layers are formed to have the same thickness such that the spaced intervals in which the plurality of nanostructures are spaced apart from each other may be the same.

The thickness of the plurality of intermediate layers 220 has a predetermined value between 50 nm and 100 nm. When the microscope measures the standard materials 100 and 200, the thicknesses of the plurality of intermediate layers 120 and 220 may be set to a predetermined value between 50 nm and 100 nm according to a shape of a probe tip of the microscope.

Figure 3:
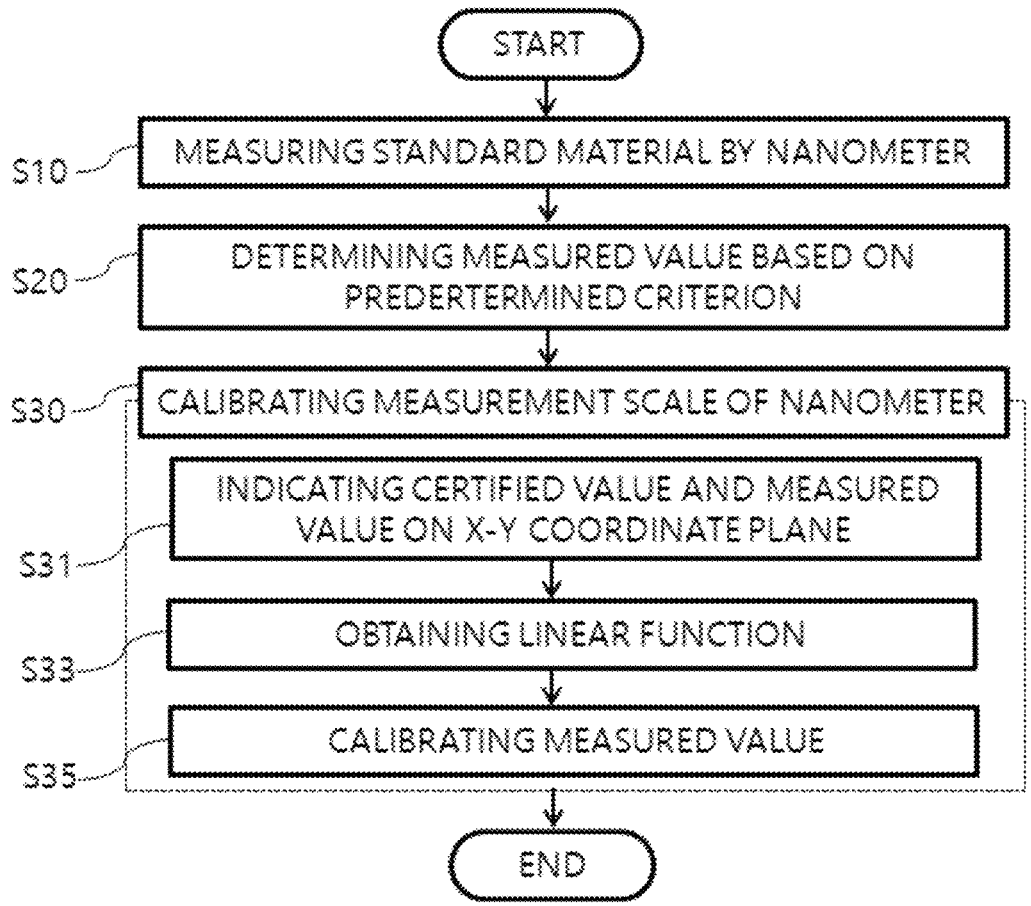
FIG. 3 is a flow chart of a method of calibrating a nano measurement scale using a standard material according to an embodiment of the present invention.
Figure 4A:
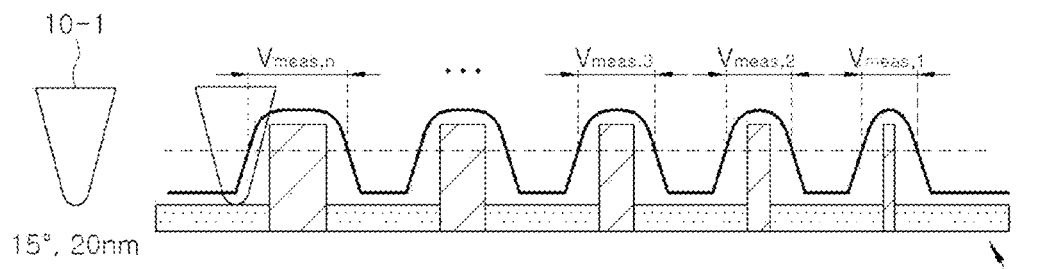
FIGS. 4A to 4D are views illustrating examples in which a difference between a measured value and an actual value occurs according to a cone half angle and a tip radius of a tip of a microscope when a microscope measures the standard material according to the second embodiment of the present invention.
Figure 4B:
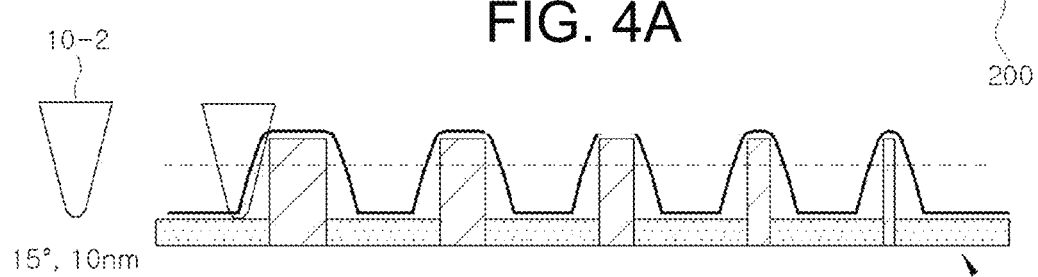
Figure 4C:
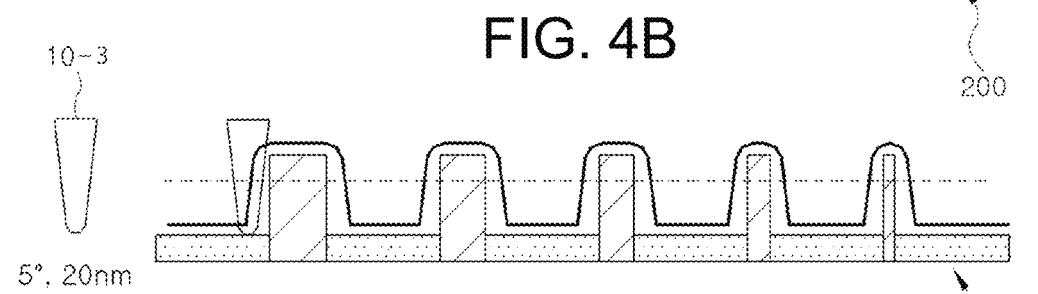
Figure 4D:
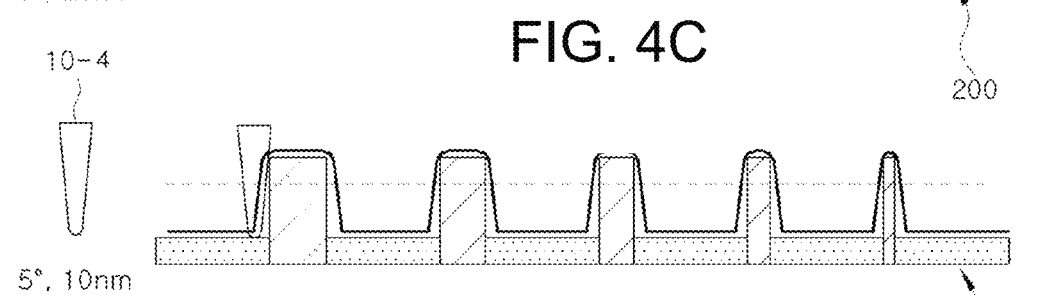

FIG. 3 is a flow chart of a method of calibrating a nano measurement scale using a standard material according to an embodiment of the present invention.

Referring to FIG. 3, a method of calibrating a nano measurement scale using a standard material according to an embodiment of the present invention includes a step S10 of measuring a standard material with a microscope, a step S20 of determining a measured value based on a predetermined criterion, and a step S30 of calibrating a measurement scale of the microscope. The standard material used in the method of calibrating the nano measurement scale is the standard material 100 or 200 including the plurality of nanostructures having certified values of different sizes as the widths according to the first or second embodiment as described above. In addition, in the method according to the present invention, the microscope measuring the size of the plurality of nanostructures of the standard material may correspond to one type of an atomic force microscope (AFM) or a scanning electron microscope (SEM).

In step S10, the widths of the plurality of nanostructures included in the standard material and having pre-designated certified values of different sizes are measured by the microscope. First, the standard material illustrated in FIGS. 1 and 2 is manufactured, and the manufactured standard material is prepared on a specimen stand of the microscope.

Figure 5:
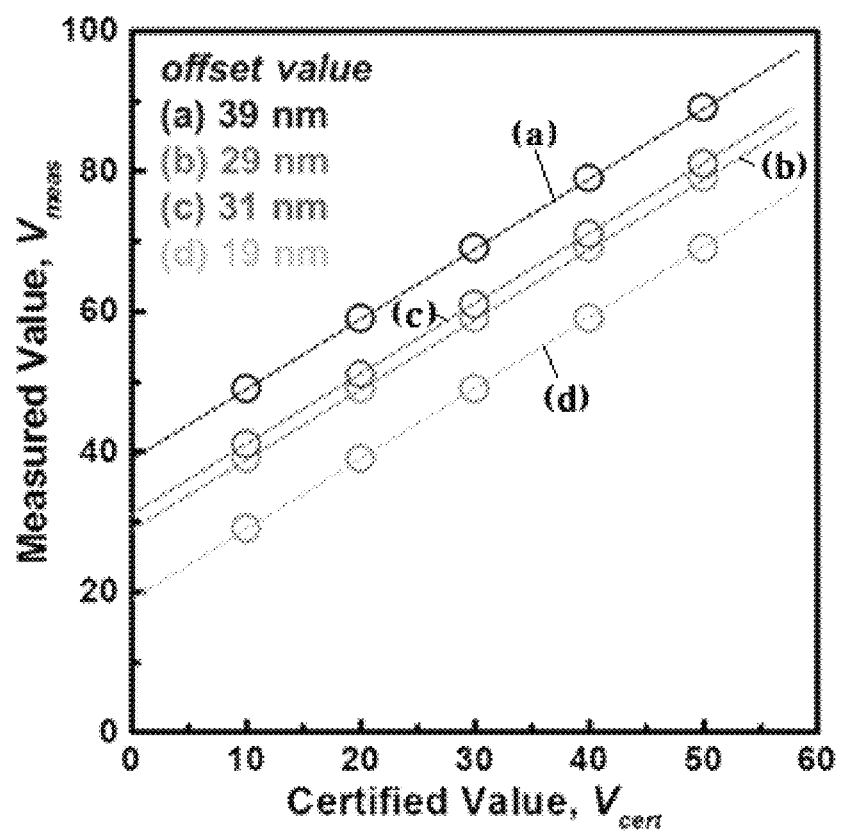
FIG. 5 is a view illustrating an example of calculating a difference (offset) between the measured values and the actual values according to the cone half angle and the tip radius of the tip of the microscope illustrated in FIGS. 4A to 4D.

FIGS. 4A to 4D are views illustrating examples in which a difference between a measured value and an actual value occurs according to a cone half angle and a tip radius of a tip of a microscope when a microscope measures the standard material according to the second embodiment of the present invention and FIG. 5 is a view illustrating an example of calculating a difference (offset) between the measured values and the actual values according to the cone half angle and the tip radius of the tip of the microscope illustrated in FIGS. 4A to 4D.

Referring to FIGS. 4A to 4D, the microscope having the probe tip 10-1, 10-2, 10-3, 10-4 illustrated in FIGS. 4A to 4D is an atomic force microscope, and as one example of step S10, the probe tip 10-1, 10-2, 10-3, 10-4 of the atomic force microscope measures the width of the plurality of nanostructures of the standard material 200, that is, the line width of the plurality of convex portions, while moving along the plurality of convex portions.

As another example of step S10, the scanning electron microscope measures the width of the plurality of nanostructures by photographing a cross section of the standard material 100. An image obtained by photographing the standard material 100 by the scanning electron microscope illustrated in FIG. 7 to be described later.

FIGS. 4A to 4D illustrate paths for measuring a standard material, which is an example of the standard material 200 having the plurality of convex portions, which is a portion of the plurality of nanostructures illustrated in FIG. 2, by an atomic force microscope having various types of probe tips 10-1, 10-2, 10-3, 10-4.

FIG. 5 illustrates certified values $V_{cert}$ which are the actual widths of the plurality of nanostructures and measured values $V_{meas}$ on an x-y coordinate plane after the atomic force microscope having the probe tips of FIGS. 4A to 4D measures an example of the standard material 200, and illustrates offset values corresponding to differences between the certified values and the measured values.

The probe tip of a microscope may not have an ideal sharpness, and it has no choice but to have a constant cone half angle and a constant radius of curvature. For this reason, when the microscope measures the standard material, the measured value of the width of the nanostructure is larger than the actual line width of the plurality of convex portions corresponding to the pre-designated certified values of different sizes. Therefore, only when calibration of the measurement scale of the microscope is necessarily accompanied to minimize the offset value through the process of calibrating the measured value of the microscope, the actual dimensions in the measurement of the line width or pitch at the nano level may be accurately measured.

Figure 6:
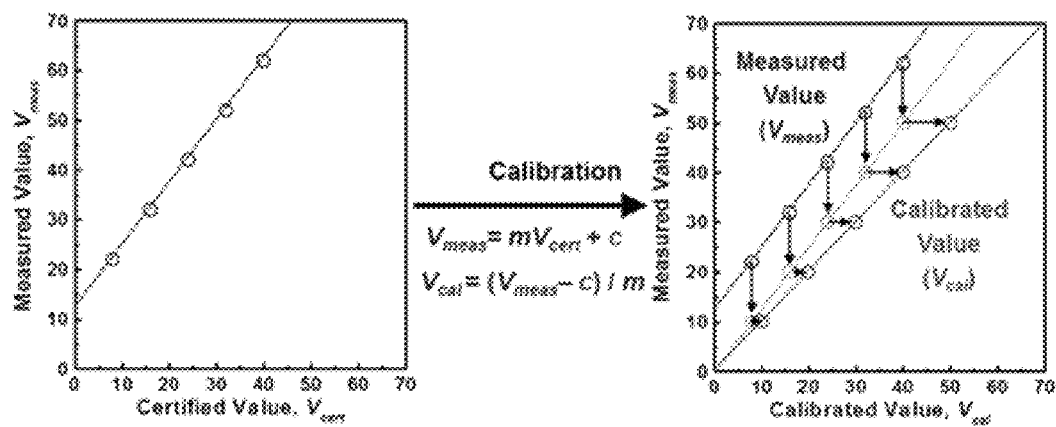
FIG. 6 illustrates a method of calibrating a nano measurement scale using a standard material according to an embodiment of the present invention.
Figure 7:
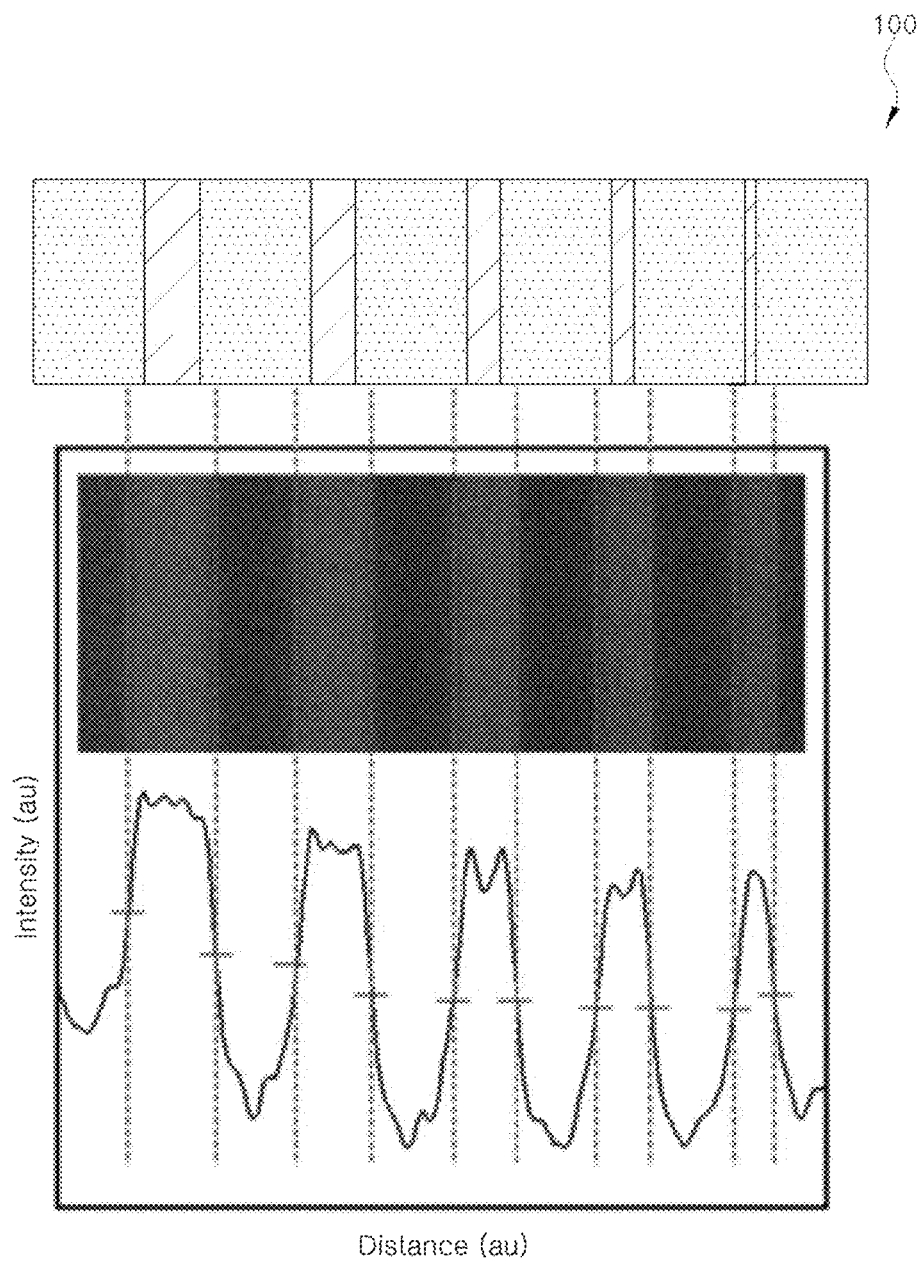
FIG. 7 illustrates the standard material according to the first embodiment of the present invention and a result of measuring the standard material according to the first embodiment of the present invention with the microscope at the same time.
Figure 8:
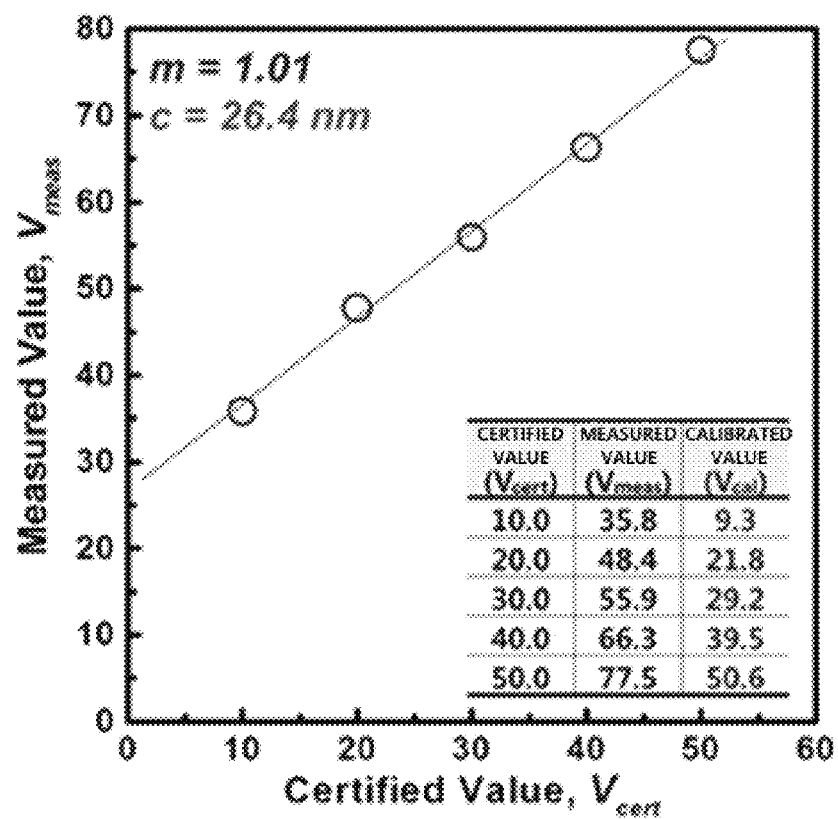
FIG. 8 is a graph illustrating certified values of the standard material according to the first embodiment of the present invention and measured values of the microscope illustrated in FIG. 7.

FIG. 6 illustrates a method of calibrating a nano measurement scale using a standard material according to an embodiment of the present invention. FIG. 7 illustrates the standard material according to the first embodiment of the present invention and a result of measuring the standard material according to the first embodiment of the present invention with the microscope at the same time, and FIG. 8 is a graph illustrating certified values of the standard material according to the first embodiment of the present invention and measured values of the microscope illustrated in FIG. 7.

Figure 9:
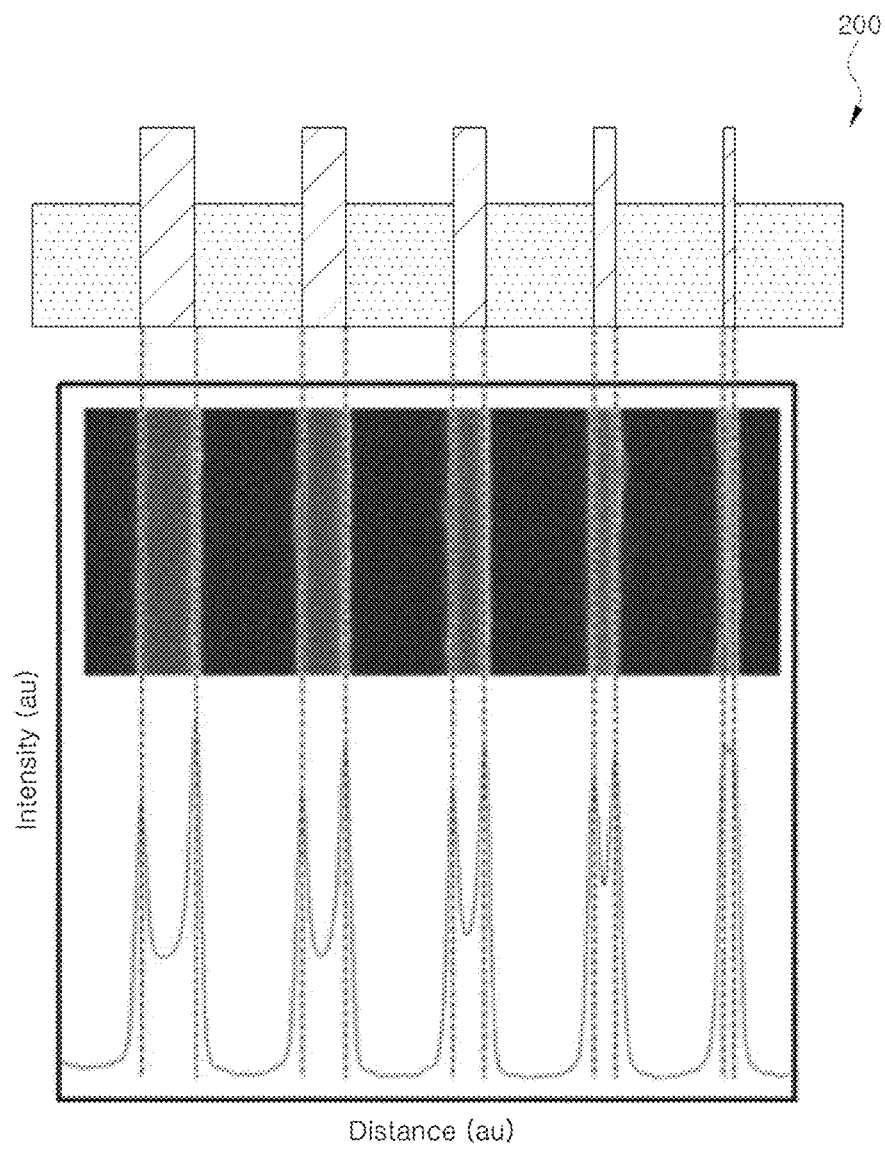
FIG. 9 illustrates the standard material according to the second embodiment of the present invention and a result of measuring the standard material according to the second embodiment of the present invention with the microscope at the same time.
Figure 10:
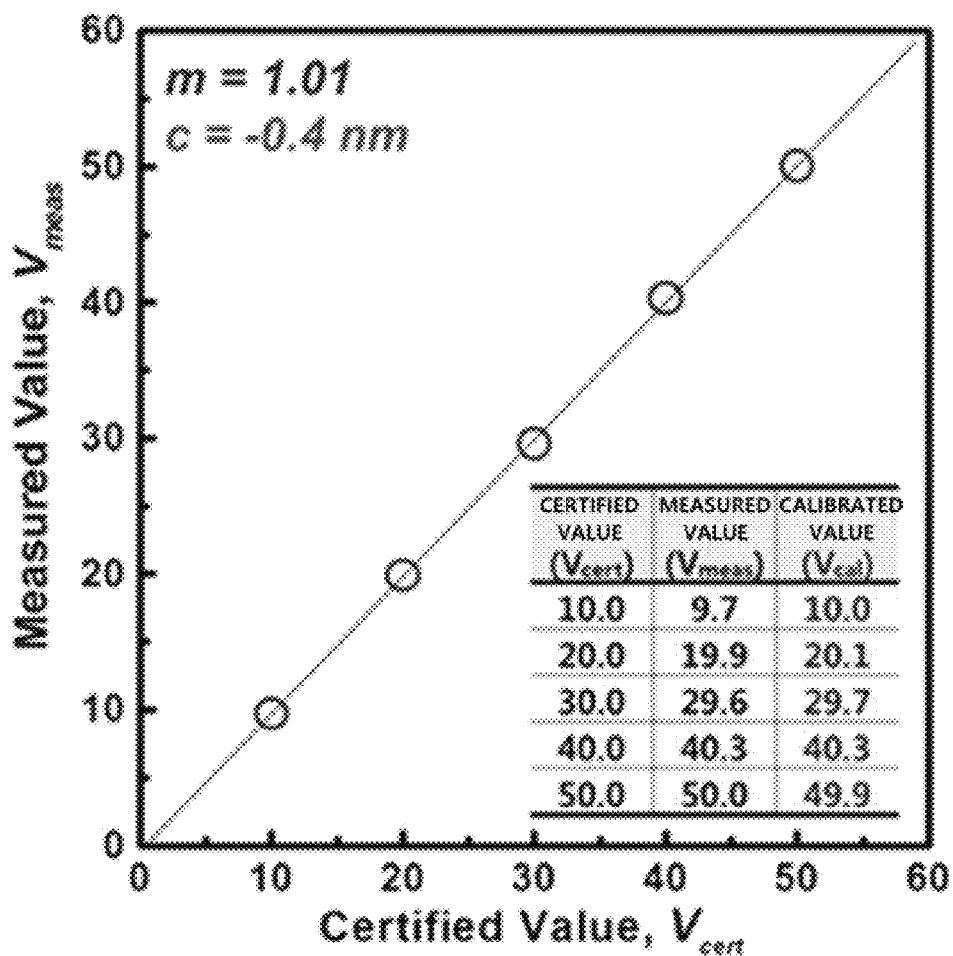
FIG. 10 is a graph illustrating certified values of the standard material according to the second embodiment of the present invention and measured values of the microscope illustrated in FIG. 9.

FIG. 9 illustrates the standard material according to the second embodiment of the present invention and a result of measuring the standard material according to the second embodiment of the present invention with the microscope at the same time, and FIG. 10 is a graph illustrating certified values of the standard material according to the second embodiment of the present invention and measured values of the microscope illustrated in FIG. 9.

In step S20, the measured values for the widths of each of the plurality of nanostructures measured by the microscope are determined based on a predetermined criterion.

FIGS. 7 and 9 include images obtained by photographing the standard material 100 and the standard material 200, respectively, with the scanning electron microscope. When determining the measured values for the widths of the plurality of nanostructures through the image photographed by the scanning electron microscope, the photographed image is converted into a contrast distribution diagram, and the measured values are determined through the distribution diagram.

In step S20, the same criterion is applied to each of the plurality of nanostructures when determining the measured values for the widths of each of the plurality of nanostructures measured by the microscope.

For example, in the example illustrated in FIG. 7, the measured values for each of the plurality of nanostructures are determined by using a position corresponding to the middle of a contrast intensity in the contrast distribution diagram for the photographed image as a boundary line. Referring to FIG. 8, when comparing the measured values for the widths of each of the plurality of nanostructures determined based on the criterion applied in FIG. 7 with the actual widths of each of the plurality of nanostructures, that is, the certified values, the offset, which is the difference between the certified value and the measured value, is 26.4 nm, which is very large, but a slope is 1.01, which is within about 1%.

As another example, in the example illustrated in FIG. 9, the measured values for each of the plurality of nanostructures are determined by using a maximum point brighter than the surroundings in the contrast distribution diagram for the photographed image as a boundary line. Referring to FIG. 10, when comparing the measured values for the widths of each of the plurality of nanostructures determined based on the criterion applied in FIG. 9 with the actual widths of each of the plurality of nanostructures, that is, the certified values, the offset, which is the difference between the certified value and the measured value, is −0.4 nm, which is very small, and the slope is also within about 1%.

In step S20, as the criterion applied when determining the measured values for the widths of each of the plurality of nanostructures measured by the microscope, other criteria, such as using an inflection point of a contrast distribution curve as a boundary line other than the criteria illustrated in FIGS. 7 and 9 may be applied.

In step S30, a measurement scale of the microscope is calibrated based on the certified values that are the widths of the plurality of nano structures included in the standard material and the measured values determined in step S20. The step S30 includes a step S31 of indicating the certified values and the measured values on the x-y coordinate plane, a step S33 of obtaining a linear function, and a step S35 of obtaining calibrated values for the measured values.

Referring to FIGS. 6, 8, and 10, in step S31, a plurality of points having certified values $V_{cert}$ corresponding to the actual widths of the plurality of nanostructures included in the standard material as an x-coordinate and the measured values $V_{meas}$ for the plurality of nanostructures determined in step S20 as a y coordinate are plotted on the x-y coordinate plane.

In step S33, a linear function having an x-axis as the certified value and a y-axis as the measured value is obtained by linearly fitting the plurality of points plotted on the x-y coordinate plane in step S31. In addition, in this step, a slope m and a y-intercept c of the linear function are obtained as illustrated in FIGS. 8 and 10.

In step S35, calibrated values for the measured values are obtained by subtracting the y-intercept c of the linear function obtained in step S33 from the measured values determined in step S20, and then dividing the subtracted value by the slope m of the linear function. When the difference between the certified value and the measured value is large as illustrated in FIG. 8, it may be seen that the calibrated value obtained by calibrating the measured value by the calibration method according to the present invention is approximate to the certified value.

By applying the method of calibrating the nano measurement scale using the standard material according to the present invention to the microscope to be calibrated, when the microscope is actually used in the process of measuring the line width or pitch of the semiconductor device, the measured value may be calibrated to approximate the actual value, and the measurement accuracy of the microscope may be improved.

The invention claimed is:

1. A method of calibrating a nano measurement scale using a standard material, the method comprising:
   measuring widths of a plurality of nanostructures included in the standard material and having pre-designated certified values of different sizes by a microscope;
   determining measured values for the widths of each of the plurality of nanostructures measured by the microscope based on a predetermined criterion; and
   calibrating a measurement scale of the microscope based on the certified values and the measured values,
   wherein the standard material includes the plurality of nanostructures having the widths set as the certified values of the pre-designated certified values of different sizes and spaced apart from each other by a predetermined interval, and a plurality of intermediate layers interposed in the intervals where the plurality of nanostructures are spaced apart,
   on one surface of the standard material in which the plurality of nanostructures and the plurality of intermediate layers are alternately stacked, a plurality of concave portions in which each of the plurality of intermediate layers is removed to a predetermined depth, and a plurality of convex portions in which each of the plurality of nanostructures protrudes from bottoms of the plurality of concave portions are formed, and
   the one surface of the standard material is perpendicular to an interface between the plurality of nanostructures and the plurality of intermediate layers.

2. The method of claim 1, wherein the width of each of the plurality of nanostructures or a line width of each of the plurality of convex portions has a designated value among values between 5 nm and 100 nm.

3. The method of claim 2, wherein the plurality of nanostructures are sequentially arranged according to the sizes of the widths.

4. The method of claim 3, wherein the width of each of the plurality of nanostructures linearly increases according to an arrangement direction.

5. The method of claim 1, wherein the plurality of intermediate layers have thicknesses having a designated value among values between 50 nm and 100 nm.

6. The method of claim 2, wherein a depth of the plurality of concave portions or a protruding length of the plurality of convex portions corresponds to a predetermined multiple of 5 to 10 times compared to a minimum width of the plurality of nanostructures.

7. The method of claim 4, wherein the calibrating the measurement scale of the microscope includes:
   indicating a plurality of points having the certified value as an x-coordinate and the measured value as a y-coordinate on an x-y coordinate plane; and
   obtaining a linear function by linearly fitting the plurality of points.

8. The method of claim 7, wherein the calibrating the measurement scale of the microscope further includes calibrating the measured values by subtracting a y-intercept of the linear function from the measured values and dividing the subtracted value by a slope of the linear function.

* * * * *